United States Patent [19]

Cattaneo et al.

[11] Patent Number: 5,004,974

[45] Date of Patent: Apr. 2, 1991

[54] ELECTRIC CURRENT SENSING DEVICE

[75] Inventors: Pierr Cattaneo, Saint-Julien; Claude Gudel, Entrembières, both of France

[73] Assignee: Liasons Electroniques-Mecaniques, Switzerland

[21] Appl. No.: 405,554

[22] Filed: Sep. 11, 1989

[30] Foreign Application Priority Data

May 30, 1989 [CH] Switzerland .................. 2031/89

[51] Int. Cl.$^5$ ............................................. G01R 1/20
[52] U.S. Cl. ............................ 324/117 R; 324/127; 336/65; 336/192
[58] Field of Search .................. 336/65, 192, 175; 324/117 R, 117 H, 127

[56] References Cited

U.S. PATENT DOCUMENTS

| | | | |
|---|---|---|---|
| 2,823,360 | 2/1958 | Jones | 336/65 |
| 3,590,480 | 6/1971 | Johnson et al. | 336/65 |
| 3,593,217 | 7/1971 | Weber | 336/65 |
| 3,721,932 | 3/1973 | Fierstien et al. | 336/65 |
| 3,735,306 | 5/1973 | Kabler et al. | 336/192 |
| 4,134,091 | 1/1979 | Rogers | 336/175 |
| 4,621,231 | 11/1986 | Heinrich et al. | 324/127 |
| 4,623,865 | 11/1986 | Riesel et al. | 336/65 |
| 4,661,792 | 4/1987 | Watkins | 336/192 |
| 4,709,205 | 11/1987 | Baurand et al. | 324/127 |
| 4,748,405 | 5/1988 | Brodyik et al. | 324/127 |

FOREIGN PATENT DOCUMENTS 2198543 6/1988 United Kingdom .

Primary Examiner—Reinhard J. Eisenzopf
Assistant Examiner—William J. Burns
Attorney, Agent, or Firm—Woodard, Emhardt, Naughton, Moriarty & McNett

[57] ABSTRACT

A current sensing device is disclosed for measuring a current flowing in a primary conductor. The primary conductor is coupled with a magnetic circuit, and a device for measuring the magnetic flux in that circuit is provided. The primary conductor comprises U-shaped portions arranged over the magnetic circuit in the manner of a rider and connected by their ends, in the form of pins, to a printed circuit. The printed circuit includes conductor elements, arranged so as to connect certain of said pins together and form together with the U-shaped portions a primary winding of a desired number of turns.

7 Claims, 3 Drawing Sheets

ELECTRIC CURRENT SENSING DEVICE

The present invention relates to an electric current sensing device for measuring a current flowing in at least one primary conductor and/or for producing an image of this current, the device including at least one magnetic circuit coupled with the said primary conductor and a device for detecting or measuring the magnetic flux in the said circuit. The invention applies more particularly to sensing devices of this type which include at least one secondary measuring winding coupled with said magnetic circuit, and in which said magnetic circuit has at least one air-gap provided with means such as a Hall cell for detecting a magnetic field. In such sensing devices, the measuring winding is fed by a measuring current producing a magnetic field in the opposite direction to the field generated by the current to be measured flowing in the primary conductor, and the Hall cell delivers a signal corresponding to the difference between these two fields. Preferably, the measuring current is controlled by the signal, so as to bring this difference to zero, the corresponding value of this current thus providing a measure of the current in the primary conductor.

The present invention has for main object to provide a sensing device of the type mentioned at the beginning, which enables manufacture to be simplified and, in particular, manufacture to be automated as far as the realization of the primary winding is concerned. The invention is aimed more particularly at providing sensing units which for one and the same basic structure may, at the time of their manufacture, be adapted very simply to different ranges of currents to be measured, or else at providing sensing modules of identical structure which, by adaptation of an outer user circuit, may be employed for a range of currents to be measured, chosen from a number of available ranges.

For this purpose, in the sensing device in accordance with the invention, the primary conductor includes a number of conductor portions, of which each one partially surrounds a section of said magnetic circuit and which at their ends form pins arranged to be able to be connected to a printed circuit, said printed circuit including conductor elements arranged so as to connect certain of the said pins together and to form, with the said conductor portions, at least one primary winding having a chosen number of turns.

In accordance with a preferred embodiment of the invention, the said conductor portions are substantially U-shaped and are arranged over the magnetic circuit in the manner of a rider. At least one group of these conductor portions is embedded in a moulded part, so as to form one piece which may be fitted over the said magnetic circuit, or over a secondary winding coupled with said magnetic circuit. The conductor elements arranged between the said pins may include bridging elements, arranged so as to connect at least two conductor portions in parallel with one another.

In accordance with one embodiment of the invention, the sensing device comprises a sensing unit including said printing circuit, this unit being arranged to be able to be mounted on an outer printed circuit having connecting terminals for the primary current, for feeding the device for detecting or measuring, and for a circuit for processing a detection or measurement signal delivered by the sensing unit.

In accordance with another embodiment, the magnetic circuit, the device for detecting or measuring, and said conductor portions form part of a sensing module arranged to be able to be mounted on said printed circuit, said circuit constituting or forming part of an outer supply and processing circuit which has connecting terminals for the primary current for feeding the device for detecting or measuring, and for a circuit for processing a signal delivered by the sensing module.

Other features, advantages and aims of the invention will become apparent from the following description of different embodiments of sensing devices according to the present invention, these embodiments being mentioned by way of example and being illustrated in the attached drawings. In the drawings.

Figure 1:
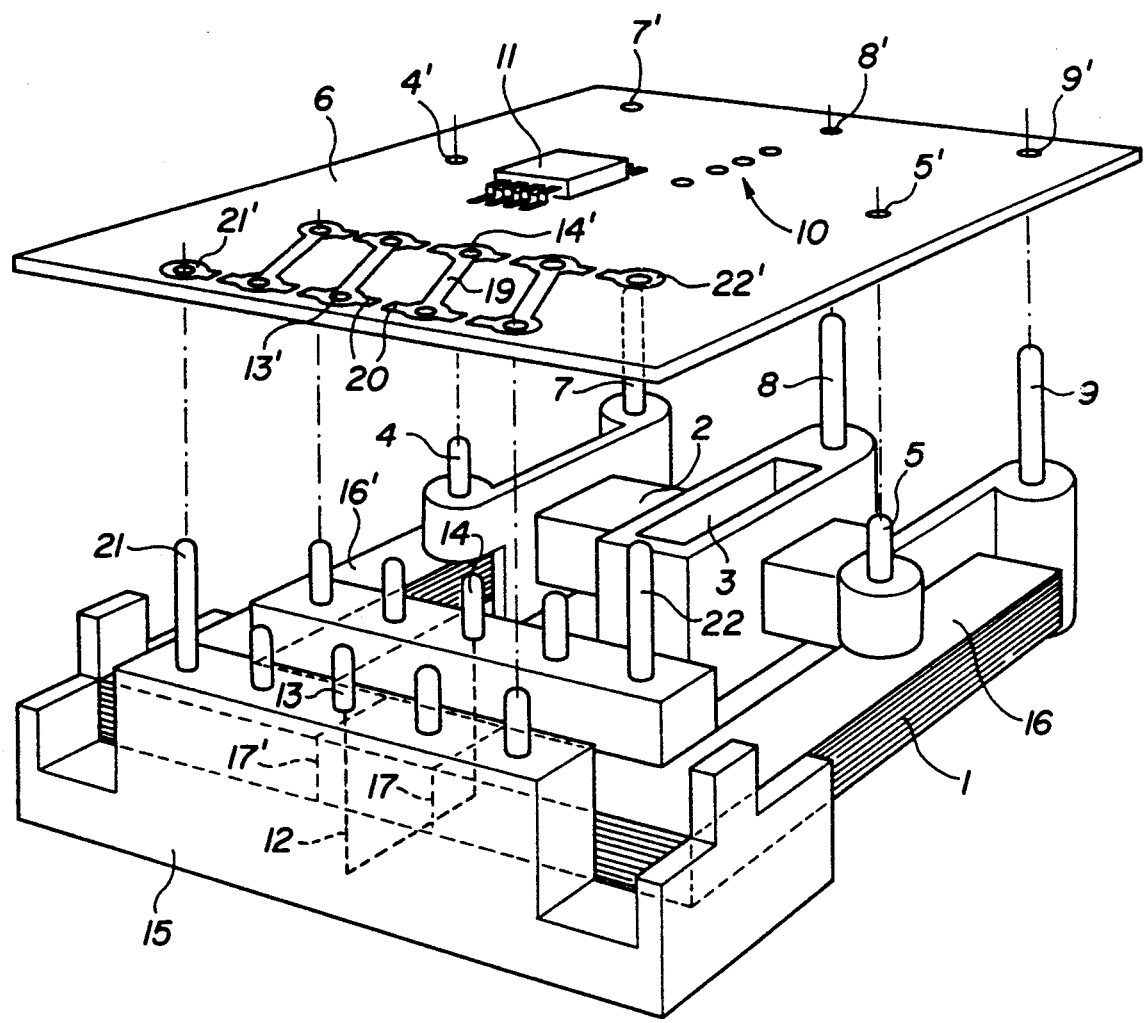
FIG. 1 is a schematic, partially exploded perspective view of a current sensing unit.

The sensing unit of FIG. 1 includes a magnetic circuit generally rectangular shape, which has an air-gap in the middle of one of its branches. A piece 2, having mainly the function of a coil body, is mounted on said branch having said air-gap, and a measuring winding (not shown) is arranged on that piece 2. The measuring winding mounted on the piece 2 can be be embedded in a plastic moulding. An opening 3 in the piece allows the insertion of a Hall cell into the air-gap of the magnetic circuit. Pins 4,5 for connection of the measuring winding to a printed circuit 6, and pins 7,8,9 for connecting this printed circuit to an outer supply and processing circuit, are made integral with the piece 2. The soldering of these various pins onto the printed circuit is effected at the places of corresponding holes 4',5',7',8' and 9'. The Hall cell is connected to the printed circuit at the points indicated by the reference 10. An electronic component mounted on the printed circuit 6 is represented, by way of example, at 11. The conductive parts of the printed circuit have not been represented in detail, except as far as the portion described below is concerned.

A primary winding of this sensing unit includes U-shaped conductor portions such as 12, each one surrounding partially, that is to say on three sides, a section of the magnetic circuit 1. The ends of these conductor portions consist of pins such as 13,14, arranged for being soldered to the printed circuit at corresponding connection points, such as 13',14'. FIG. 1 shows a group of five U-shaped conductor portions arranged in parallel with one another and embedded in a moulding, so as to form a piece 15 arranged on the magnetic circuit in the manner of a rider. The ends of this piece may, in addition, be designed for holding together the magnetic circuit 1 which consists of a stack of U-shaped metal sheets. In this stack, two sheets such as 16,16' are arranged in each plane, so that their respective ends form on one side the air-gap of the magnetic circuit, and on the other side a magnetic joint, the superimposed metal sheets overlapping in the respective planes between alternating end junctions indicated by 17 and 17'.

Figure 3:
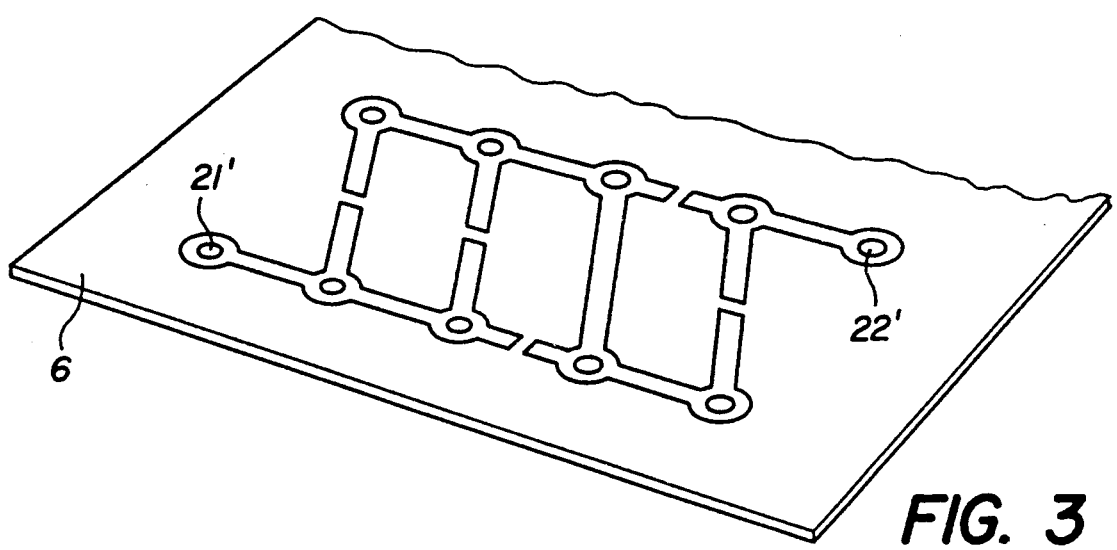
Figure 4:
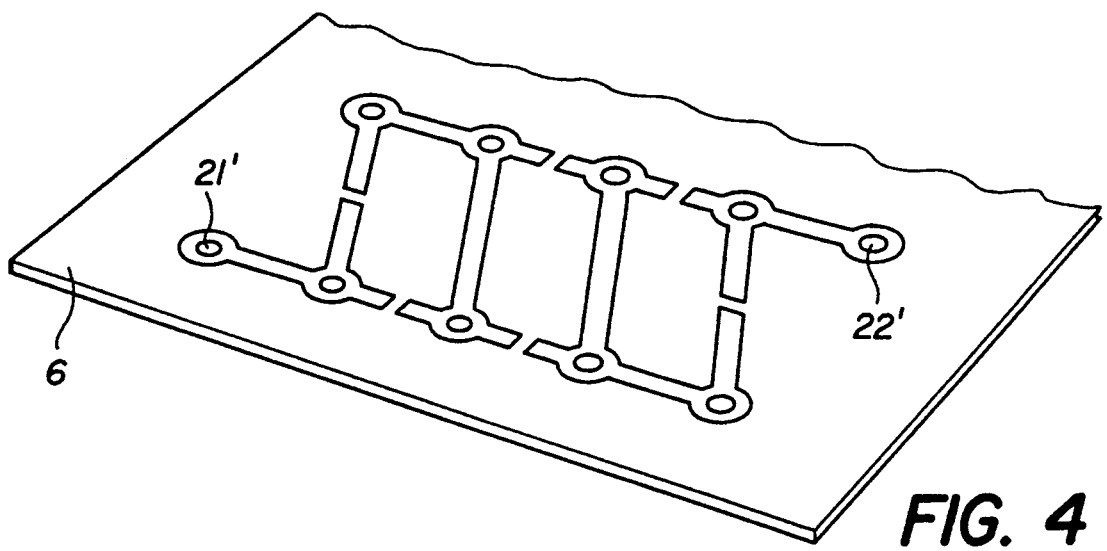
Figure 5:
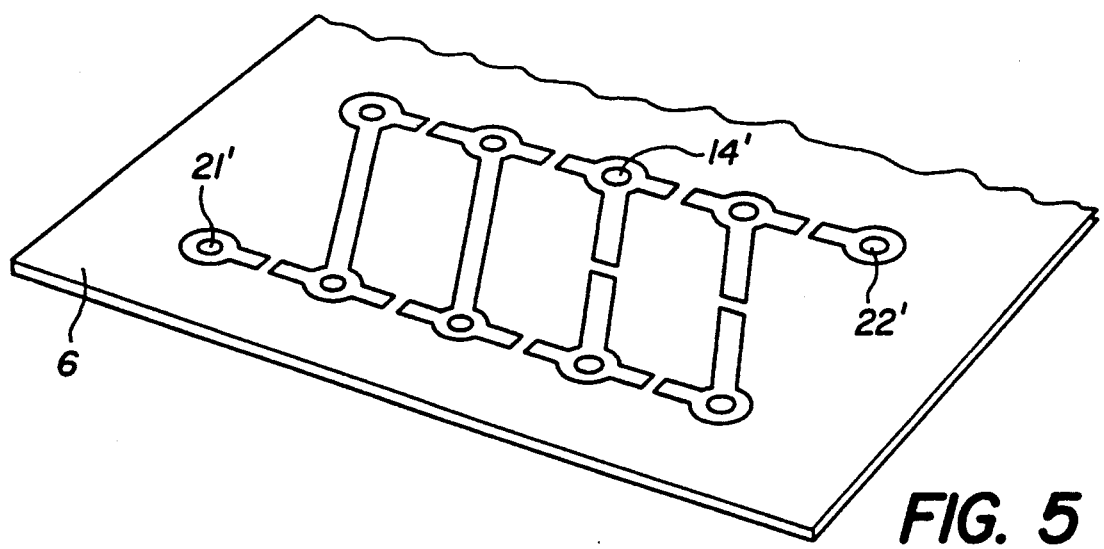

The turns of the primary winding of this sensing unit are closed on the printed circuit by means of conductor elements arranged between selected connection points of the various pins. These conductor elements consist, for example, of metallized portions of the printed circuit arranged for connecting desired connection points, such as the portions 19,20 in FIG. 1. These portions may be interrupted like the portion 20, depending upon the desired configuration of the winding. Thus, in the example of FIG. 1, the conductor elements remaining intact, connect the different U-shaped conductor portions, such as 12, so as to form five turns of primary winding between external connection pins 21,22 soldered to the printed circuit at 21',22' FIGS. 3,4 and 5 show other examples of connection of the U-shaped conductor portions. The winding formed in accordance with FIG. 3, in which three and two U-shaped conductor portions are respectively connected in parallel with one another, has two turns, whereas the example of FIG. 4 represents a way of forming three turns between the same external connection pins 21,22. FIG. 5 shows another example of realization of three turns, according to which the winding is formed between the pin 21 and the intermediate pin 14, which in this case would serve as an external connection pin, but which might equally well be connected, through conductor elements provided on the printed circuit, to the pin 22. It goes without saying that other variants are possible for realizing primary windings of one, two, three or four turns. For forming a primary winding of only one turn, one preferably connects together the five pins aligned respectively on opposite sides of the magnetic circuit, the pins 21 and 22 serving, for example, for the external connection.

In accordance with an embodiment particularly advantageous for automated manufacture, the conductor elements which ensure the connection between the different U-shaped conductor portions on the printed circuit may consist of bridging elements and, in particular, of resistances of zero Ohms in SMD (surface mounted devices) technique, these resistances being mounted between chosen portions of metallisation connected to the different pins of the winding.

As illustrated in FIG. 1, the external connection pins 21,22 in particular, are longer than the pins such as 4,5,13,14 etc. which serve only for connection to the printed circuit 6 and which may, for example be cut off at the height of the corresponding soldering. The longer pins, namely besides 21,22, the pins 7,8,9 as shown in FIG. 1, enable the sensing unit to be connected to an outer supply and processing circuit, so as to realize an assembly such as that described, for example, in the published British patent application GB 2 198 543.

The description of the structure and of the operation of such an assembly is not repeated here. It will be noted, however, that the outer circuit, in the meaning of the present description, is generally a printed circuit having in particular respective connecting terminals for the primary current, for the feeding of the detecting and measuring circuit of the sensing unit through pins 7,8 and for a circuit for further processing the measuring signal delivered by the sensing unit at the pin 9. It is further to be noted that in accordance with another embodiment, the piece 15 may be designed to fit in the manner of a rider over the secondary measuring winding in order to ensure better coupling between the primary and secondary windings.

Figure 2:
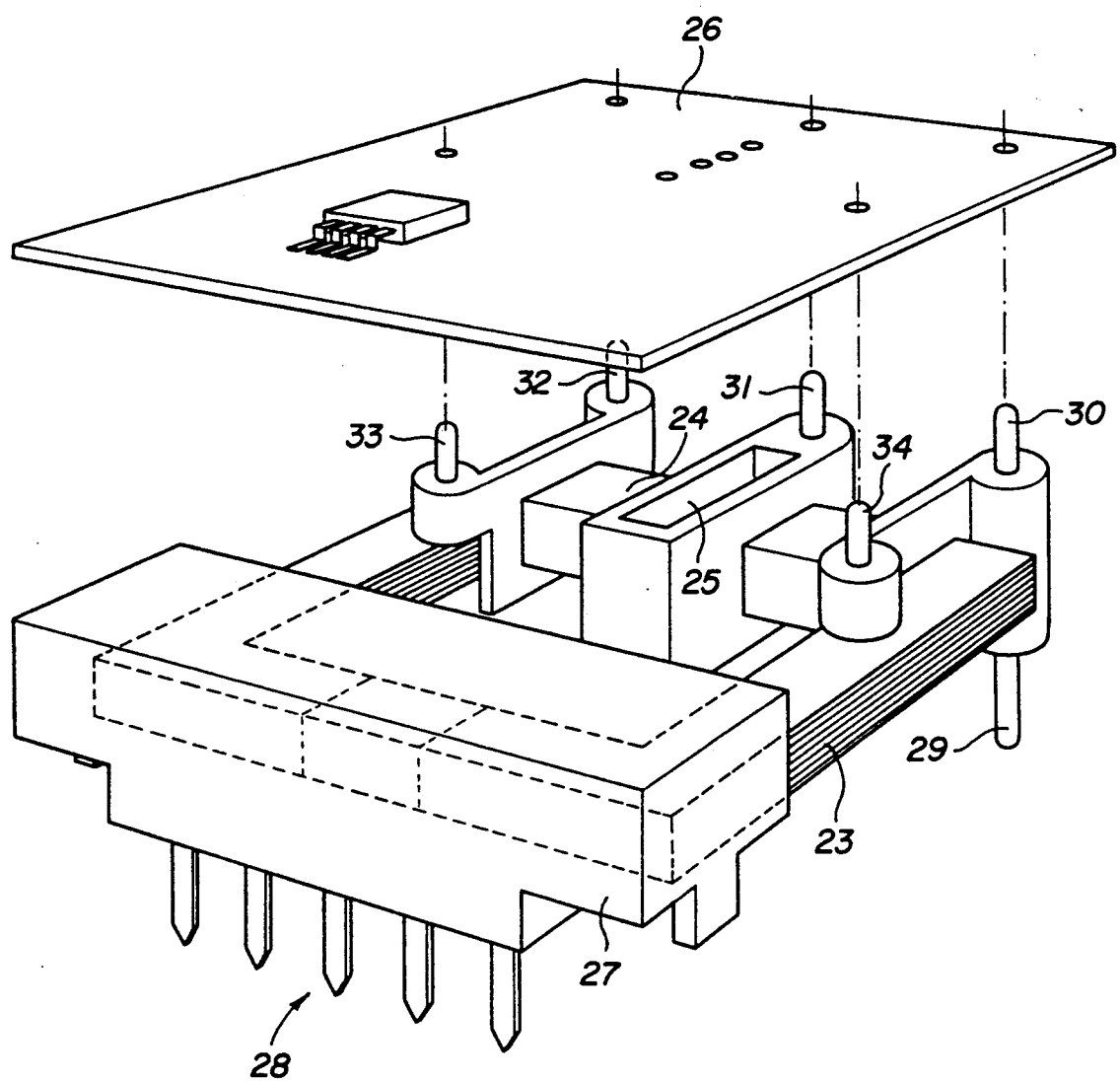
FIG. 2 is a view similar to that of FIG. 1, but inverted with respect to the outer user circuit, of a sensing module; and, FIGS. 3, 4, and 5 are views illustrating different ways of connecting the primary conductor portions of the present device.

FIG. 2 illustrates an embodiment similar to that of FIG. 1, according to which a magnetic circuit 23, a secondary measuring winding (not shown) arranged on a piece 24, a Hall cell inserted in an air-gap of the magnetic circuit through a slot 25, a printed circuit 26 and a rider-like piece 27 fitted over the magnetic circuit and containing U-shaped conductor portions with ends formed as pins 28, are assembled to form a sensing module in which, contrary to the case of the unit in accordance with FIG. 1, the turns of the primary winding are not yet closed. The closure of the turns, which may be realized in accordance with a configuration similar to that mentioned in connection with FIG. 1, is effected on a portion of an outer printed circuit upon which the present module is mounted. The pins 29, ten in number, for example, all serve in this case as pins for external connection in order to allow the realization of the desired primary winding. It will be noted that in the shown embodiments, the external connection pins are arranged at the side remote from the printed circuit 26 of the module. Thus a pin 29 is arranged in prolongation of a pin 30, directed towards the printed circuit 26 for the internal connection to this circuit, and external connection pins, which are not visible on the drawing, are arranged in a similar manner, respectively in prolongation of the pins for internal connection 31 and 32. Pins 33 and 34 serve solely for connection of the measuring winding to the printed circuit 26. The operation of such a module, once mounted on the outer supply and processing circuit, upon which the user will have realized a chosen the configuration of the primary winding, is similar to that of the unit of FIG. 1.

In the devices represented in FIGS. 1 and 2, the number of turns of the primary winding may be chosen between one and five, which allows to choose, for a given number of ampere-turns of the sensing device, for example for 25 ampere-turns (r.m.s.) a respective range of currents to be measured, in this case, between 25 and 5 amperes r.m.s. Of course, the maximum number of turns of the primary winding may differ from five and, in addition, more than one primary winding may be provided on the magnetic circuit, for example for achieving a differential measurement of primary currents.

The present design of the primary winding simplifies the automatic realization of such a winding, in particular in the manufacture of sensing units such as described above. In the case of sensing modules, for which the circuit for closure of the primary turns forms part of an outer user's circuit, each type of module designed for a given maximum current offers the user of the possibility of choosing the desired range of measurement himself. This concept, of course, leads to an important simplification in the manufacture and distribution of the product in one or other form, whilst furthermore allowing to make available sensing devices which have, in the lowest current range, for example in the 5 ampere range, the same accuracy as in the highest range, for example that of 25 amperes, say for example in both ranges an accuracy of 1%. It should likewise be noted that the manufacture of the magnetic circuit is facilitated by the fact that only one closed winding, the secondary winding, must be placed on this circuit.

The present invention thus provides considerable advantages for the serial manufacture of current sensing devices of the type mentioned, and allows great flexibility both in the manufacture and in the use of these sensing devices.

We claim:

1. An electric sensing device for measuring a current flowing in at least one primary conductor and/or for producing a representation of this current, the device including at least one magnetic circuit, coupled with the said primary conductor, and a device for detecting or measuring the magnetic flux in the said circuit, said primary conductor comprising several substantially U-shaped conductor portions, said portions being arranged to each partially surround a section of the said magnetic circuit and being arranged for connection to a connecting device, said connecting device being selected among several connecting devices having each conductor element arranged for connecting certain of the said conductor portion together so as to form with the said conductor portions at least one primary winding having a respective chosen number of turns.

2. A sensing device as claimed in claim 1, wherein the connecting device comprises a printed circuit, said U-shaped conductor portions having their ends formed as pins for connection to said printed circuit.

3. A sensing device as claimed in claim 2, wherein at least one group of the said conductor portions is embedded in a moulding and is part of a piece which may be fitted over the said magnetic circuit.

4. A sensing device as claimed in claim 2, wherein at least one secondary winding coupled with the said magnetic circuit, wherein at least one group of the said conductor portions is embedded in a moulding, and is part of a piece which may be fitted over the said secondary winding.

5. A sensing device as claimed in one of the claims 1 to 4, wherein said conductor elements include bridging elements, arranged so as to connect at least two conductor portions in parallel with one another.

6. A sensing device as claimed in claim 2, comprising a current sensing unit including the said printed circuit, said unit being arranged to be able to be mounted on an outer printed circuit, which outer circuit has respective connecting terminals for the primary current, for feeding the device for detecting or measuring, and for a circuit for processing a detection or measurement signal delivered by the sensing unit.

7. A sensing device as claimed in claim 2, wherein said magnetic circuit, said device for detecting or measuring and said conductor portions form part of a sensing module arranged to be able to be mounted on the said printed circuit, said printed circuit constituting or being part of an outer supply and processing circuit, which has respective connecting terminals for the primary current, for feeding the device for detecting or measuring, and for a circuit for processing a signal delivered by the sensing module.

* * * * *

UNITED STATES PATENT AND TRADEMARK OFFICE
CERTIFICATE OF CORRECTION

PATENT NO. : 5,004,974

DATED : April 2, 1991

INVENTOR(S) : Pierre Cattaneo, et al

It is certified that error appears in the above-identified patent and that said Letters Patent is hereby corrected as shown below:

On the title page:

Item (75), in the name of the inventors, delete "Pierr" and insert in lieu thereof --Pierre--.

Col. 2, line 7, after the word "current" insert a comma.

Col. 2, line 24, after the word "circuit" insert --1 of--.

Col. 3, line 10, after the numerals "21',22'" insert a period.

Col. 5, line 10, delete the word "portion" and insert in lieu thereof the word --portions--.

Col. 5, line 22, delete the word "wherein" and insert in lieu thereof the word --including--.

Signed and Sealed this

Twenty-seventh Day of October, 1992

Attest:

DOUGLAS B. COMER

*Attesting Officer*     *Acting Commissioner of Patents and Trademarks*